US008410808B2

(12) United States Patent
Naoi et al.

(10) Patent No.: US 8,410,808 B2
(45) Date of Patent: Apr. 2, 2013

(54) ANISOTROPIC CONDUCTIVE CONNECTOR, PROBE MEMBER AND WAFER INSPECTION SYSTEM

(75) Inventors: Masaya Naoi, Minato-ku (JP); Hitoshi Fujiyama, Minato-ku (JP); Ichihiro Miura, Minato-ku (JP)

(73) Assignee: JSR Corporation, Tokyo (JP)

( * ) Notice: Subject to any disclaimer, the term of this patent is extended or adjusted under 35 U.S.C. 154(b) by 691 days.

(21) Appl. No.: 12/532,320

(22) PCT Filed: Mar. 27, 2008

(86) PCT No.: PCT/JP2008/055826
§ 371 (c)(1),
(2), (4) Date: Sep. 21, 2009

(87) PCT Pub. No.: WO2008/120654
PCT Pub. Date: Oct. 9, 2008

(65) Prior Publication Data
US 2010/0127724 A1 May 27, 2010

(30) Foreign Application Priority Data
Mar. 30, 2007 (JP) ................. 2007-091814

(51) Int. Cl.
*G01R 31/26* (2006.01)
(52) U.S. Cl. ................. 324/762.01
(58) Field of Classification Search .. 324/762.01–762.1, 324/754.01–754.3, 755.01–755.1; 257/48; 438/14–18
See application file for complete search history.

(56) References Cited

U.S. PATENT DOCUMENTS 4,292,261 A 9/1981 Kotani et al.
6,969,622 B1 11/2005 Kokubo et al.
7,049,836 B2 * 5/2006 Setaka ............... 324/755.08
7,095,241 B2 8/2006 Setaka et al.
(Continued)

FOREIGN PATENT DOCUMENTS

| JP | 51 93393 | 8/1976 |
|---|---|---|
| JP | 53 147772 | 12/1978 |
| JP | 61 250906 | 11/1986 |
| JP | 2002 334732 | 11/2002 |

*Primary Examiner* — Tung X Nguyen
(74) *Attorney, Agent, or Firm* — Oblon, Spivak, McClelland, Maier & Neustadt, L.L.P.

(57) ABSTRACT

Provided is an anisotropic conductive connector and a prove member, each of which ensures that all of the conductive parts exhibit uniform conductivity when a pressing force is applied, even when the inspection target wafer has a large area and total number of inspection target electrodes of integrated circuits is 10,000 or more, and a wafer inspection system including the probe member. The anisotropic conductive connector includes a frame plate in which a plurality of anisotropic conductive film placement holes are formed, and elastic anisotropic conductive films respectively disposed in the anisotropic conductive film placement holes in the frame plate and supported by a peripheral part of the frame plate around the corresponding anisotropic conductive film placement hole, each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and an insulating part that insulates the connection conductive parts to one another, and the connection conductive parts of the elastic anisotropic conductive films disposed in a peripheral area of the frame plate having a thickness smaller than that of the connection conductive parts of the elastic anisotropic conductive films disposed in a center area of the frame plate.

8 Claims, 6 Drawing Sheets

U.S. PATENT DOCUMENTS

| | | |
|---|---|---|
| 7,323,712 B2 | 1/2008 | Kokubo et al. |
| 7,393,471 B2 * | 7/2008 | Inoue et al. .................. 252/500 |
| 7,541,820 B2 | 6/2009 | Amemiya et al. |
| 2006/0033100 A1 | 2/2006 | Kokubo et al. |
| 2006/0148285 A1 | 7/2006 | Naoi et al. |

* cited by examiner

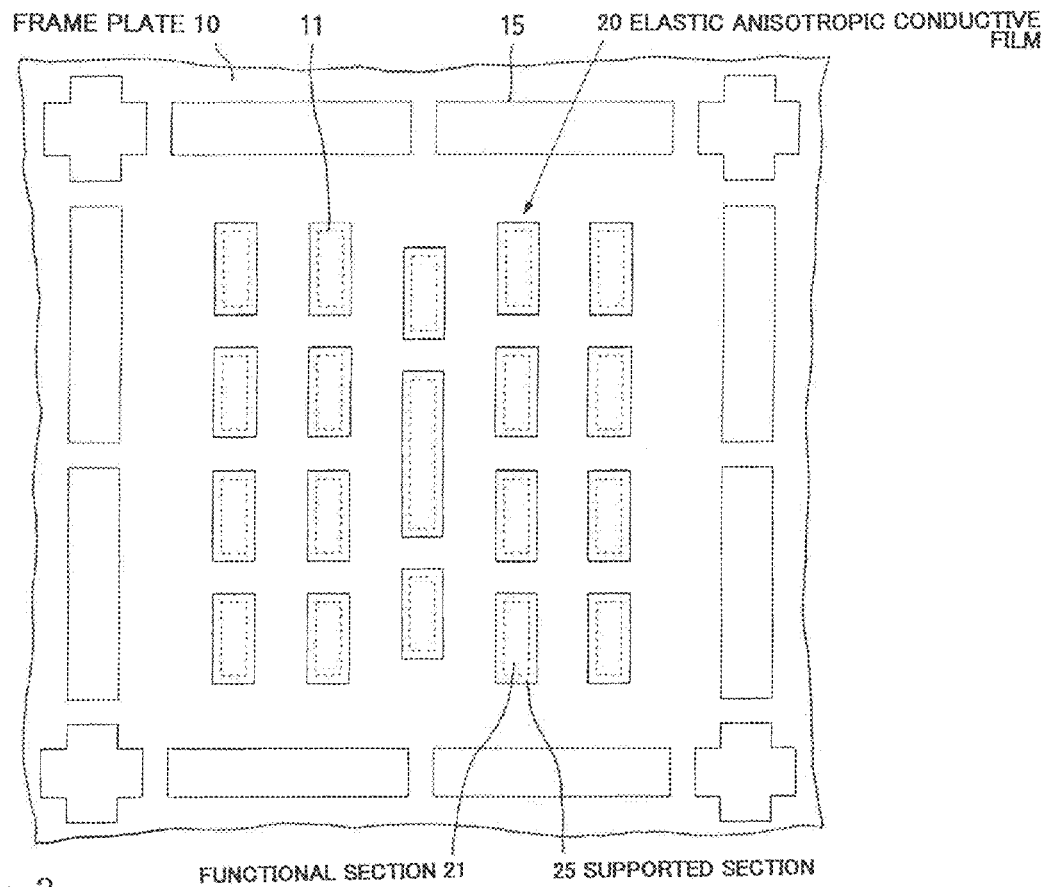
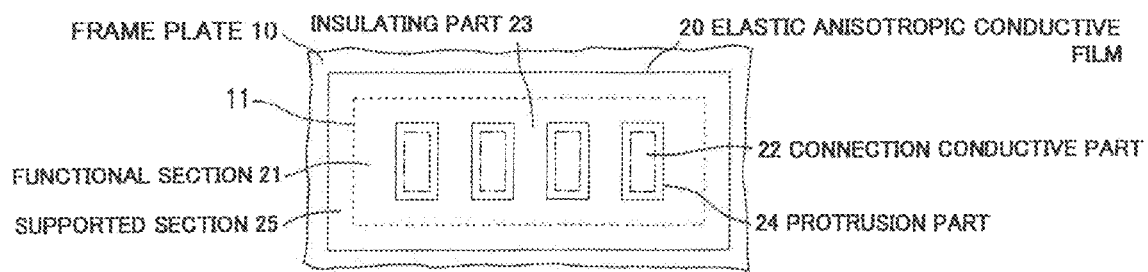
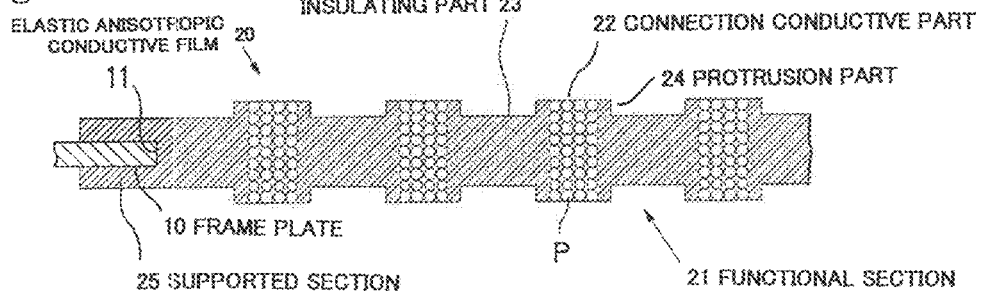

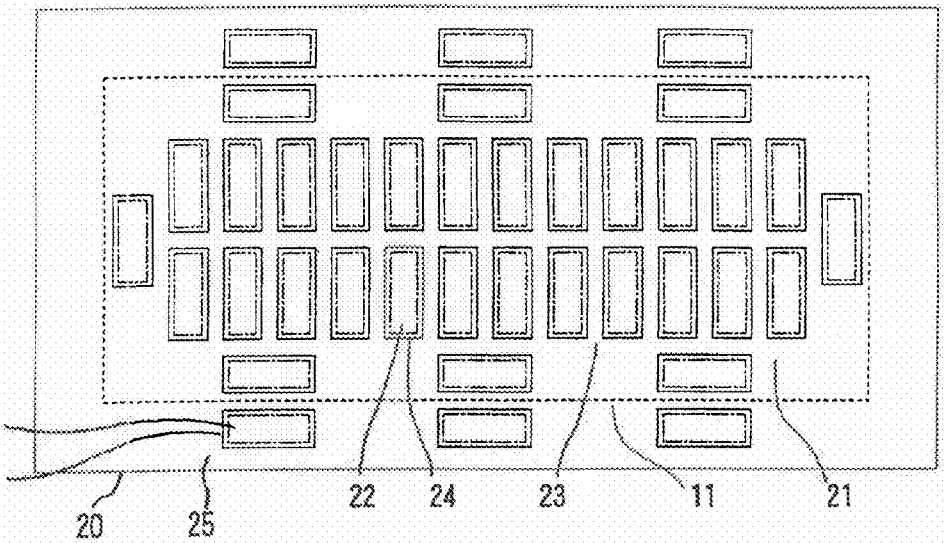

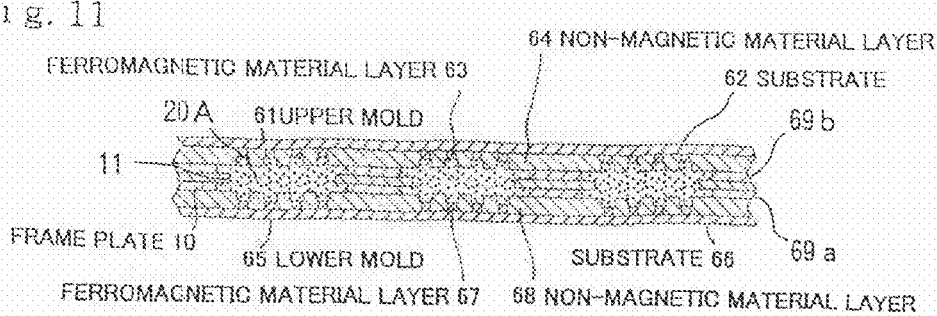
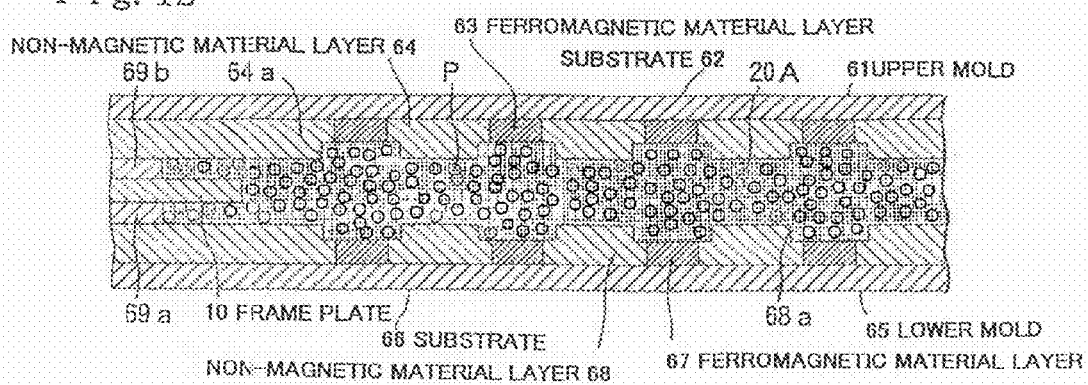
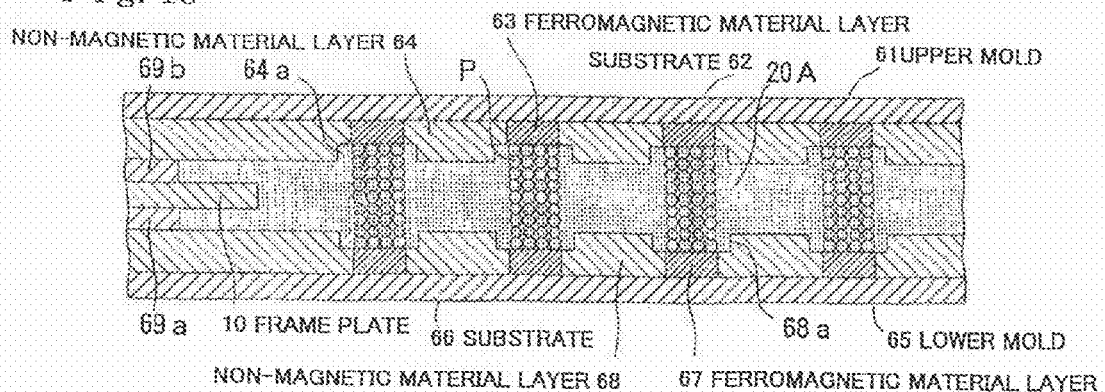

ANISOTROPIC CONDUCTIVE CONNECTOR, PROBE MEMBER AND WAFER INSPECTION SYSTEM

TECHNICAL FIELD

The present invention relates to an anisotropic conductive connector that is used to conduct an electrical inspection of a plurality of integrated circuits formed on a wafer in a state of the wafer, a probe member including the anisotropic conductive connector, and a wafer inspection system including the probe member. More particularly, the present invention relates to an anisotropic conductive connector that is suitably used to conduct an electrical inspection of a plurality of integrated circuits formed on a wafer when the wafer has a diameter of 12 inches or more and the total number of inspection target electrodes of the integrated circuits formed on the wafer is 10,000 or more, for example, a probe member including the anisotropic conductive connector, and a wafer inspection system including the probe member.

BACKGROUND ART

Generally, in a production process of semiconductor integrated circuit devices, a number of integrated circuits are formed on a wafer formed of silicon or the like, and probe tests are conducted in which the basic electrical characteristics of the respective integrated circuits are inspected to screen out defective integrated circuits. The wafer is then diced to obtain semiconductor chips, and each of the semiconductor chips is placed and sealed in an appropriate package. Further, burn-in tests are conducted in which electrical characteristics of the respective packaged semiconductor integrated circuit devices are inspected in a high temperature environment to screen out semiconductor integrated circuit devices having latent defects.

In an electrical inspection of the integrated circuits such as the probe test or burn-in test, a probe member is used to electrically connect the respective inspection target electrodes of the inspection target to a tester. As such a probe member, that comprising an inspection circuit board on which inspection electrodes are formed in a pattern corresponding to a pattern of the inspection target electrodes, and an anisotropic conductive elastomer sheet that is disposed on the inspection circuit board, has been known.

As anisotropic conductive elastomer sheets, those having various structures have heretofore been known. For example, Patent Document 1 discloses an anisotropic conductive elastomer sheet obtained by uniformly dispersing metal particles in an elastomer (hereinafter referred to as "dispersion-type anisotropic conductive elastomer sheet"), Patent Document 2 discloses an anisotropic conductive elastomer sheet in which a number of conductive parts extending in the thicknesswise direction of the anisotropic conductive elastomer sheet and an insulating part that insulates the conductive parts to one another are formed by non-uniformly distributing conductive magnetic particles in an elastomer (hereinafter referred to as "unevenly distributed-type anisotropic conductive elastomer sheet"), and Patent Document 3 discloses an unevenly distributed-type anisotropic conductive elastomer sheet in which surfaces of the conductive parts and the insulating part differ in level.

Since the conductive parts are formed in the unevenly distributed-type anisotropic conductive elastomer sheet in a pattern corresponding to the pattern of the inspection target electrodes of the inspection target integrated circuit, the unevenly distributed-type anisotropic conductive elastomer sheet can achieve with high reliability electrical connection of the electrodes to an integrated circuit or the like in which arrangement pitch of the inspection target electrodes, i.e., center-to-center distance between adjacent inspection target electrodes is short, as compared with the dispersion-type anisotropic conductive elastomer sheet.

Incidentally, in the probe test conducted on the integrated circuits formed on a wafer, a method is heretofore employed in which the wafer is divided into a plurality of areas in each of which 16 or 32 integrated circuits in a number of integrated circuits are formed, and the probe test is collectively conducted on all of the integrated circuits formed in one of the areas, and the probe test is then sequentially conducted on the integrated circuits formed in the remaining areas.

In recent years, it has been desired to collectively conduct the probe test on 64, 124, or all of the integrated circuits in a number of integrated circuits formed on a wafer in order to improve the inspection efficiency and reduce the inspection cost.

On the other hand, in the burn-in test, since the inspection target integrated circuit devices are minute and have poor handling capability, a long time is required to conduct electrical inspection of a number of integrated circuit devices individually, and thus the inspection cost is considerably high. By such a reason, a wafer level burn-in (WLBI) test in which a burn-in test is collectively conducted on a number of integrated circuits formed on a wafer in a state of the wafer has been proposed (see Patent Document 4).

However, when the inspection target wafer has a diameter as large as 12 inches or more and the number of inspection target electrodes is 10,000 or more, particularly 20,000 or more, for example, wherein arrangement pitch of the inspection target electrodes of each integrated circuit is extremely small, the following problems are encountered when the above anisotropic conductive connector as a probe member is used for the probe test or WLBI test.

Specifically, when inspecting a wafer having a diameter of 12 inches (about 30 cm), for example, it is necessary to use an anisotropic conductive connector that includes an anisotropic conductive elastomer sheet having a diameter of 12 inches or so.

However, when such an anisotropic conductive elastomer sheet is compressed by the wafer and the inspection circuit board, the conductive parts disposed in a peripheral area of the anisotropic conductive elastomer sheet may be sufficiently compressed, but the conductive parts disposed in a center area of the anisotropic conductive elastomer sheet are not sufficiently compressed. Therefore, conductivity of the conductive parts becomes non-uniform.

In order to sufficiently compress the conductive parts disposed in the center area of the anisotropic conductive elastomer sheet, it is necessary to press by an increased pressing force. In this case, a problem is encountered in that, since an excessive pressing force is applied to the conductive parts disposed in the peripheral area of the anisotropic conductive elastomer sheet, the conductive parts disposed in the peripheral area break and their conductivity decreases when used repeatedly, with a result that a long service life thereof could not be availed.

Patent Document 1: JP-A-51-93393
Patent Document 2: JP-A-53-147772
Patent Document 3: JP-A-61-250906
Patent Document 4: JP-A-2002-334732

DISCLOSURE OF THE INVENTION

The present invention has been completed in view of the above situation. A first object of the present invention is to provide an anisotropic conductive connector that is used to conduct an electrical inspection of a plurality of integrated circuits formed on a wafer in a state of the wafer wherein uniform conductivity is achieved in all of the conductive parts when pressed, even when the inspection target wafer has a diameter as large as 12 inches or more and total number of inspection target electrodes of the integrated circuits formed on the wafer is 10,000 or more, a probe member, and a wafer inspection system including the probe member.

A second object of the present invention is to provide an anisotropic conductive connector that is used to conduct an electrical inspection of a plurality of integrated circuits formed on a wafer in a state of the wafer wherein a decrease in conductivity of the conductive parts disposed in the peripheral area is inhibited so as to have a long service life, when the anisotropic conductive connector is repeatedly used many times over, even when the inspection target wafer has a diameter as large as 12 inches or more and the total number of inspection target electrodes of the integrated circuits formed on the wafer is 10,000 or more, for example, a probe member, and a wafer inspection system including the probe member.

According to the present invention, there is provided an anisotropic conductive connector comprising:

a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and an insulating part that insulates the connection conductive parts to one another, and the connection conductive parts of the elastic anisotropic conductive films disposed in a peripheral area of the frame plate have a thickness smaller than that of the connection conductive parts of the elastic anisotropic conductive films disposed in a center area of the frame plate (hereinafter may be referred to as "first invention").

According to the present invention, there is provided an anisotropic conductive connector comprising:

a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and an insulating part that insulates the connection conductive parts to one another, and the elastic polymer substance forming the connection conductive parts of the elastic anisotropic conductive films disposed in a peripheral area of the frame plate have a durometer hardness higher than that of the elastic polymer substance forming the connection conductive parts of the elastic anisotropic conductive films disposed in a center area of the frame plate (hereinafter may be referred to as "second invention").

According to the present invention, there is provided an anisotropic conductive connector comprising:

a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and an insulating part that insulates the connection conductive parts to one another, and the connection conductive parts of the elastic anisotropic conductive films disposed in a peripheral area of the frame plate have a content of the conductive particles higher than that of the connection conductive parts of the elastic anisotropic conductive films disposed in a center area of the frame plate (hereinafter may be referred to as "third invention").

According to the present invention, there is provided an anisotropic conductive connector comprising:

a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and an insulating part that insulates the connection conductive parts to one another, and the connection conductive parts of the elastic anisotropic conductive films disposed in a peripheral area of the frame plate have a horizontal cross-sectional area larger than that of the connection conductive parts of the elastic anisotropic conductive films disposed in a center area of the frame plate (hereinafter may be referred to as "fourth invention").

According to the present invention, there is provided an anisotropic conductive connector that is used to conduct an electrical inspection of each of a plurality of integrated circuits formed on a wafer in a state of the wafer comprising:

a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and an insulating part that insulates the connection conductive parts to one another, and at least the elastic anisotropic conductive films disposed in a peripheral area of the frame plate further include, in addition to the connection conductive parts, a non-connection conductive part extending in the thicknesswise direction of the elastic anisotropic conductive film and contain magnetic conductive particles densely in an elastic polymer substance; and when the total number of the non-connection conductive parts of the elastic anisotropic conductive films that are disposed in a center area of the frame plate and are to be connected to one of the integrated circuits on the wafer is referred to as A, and the total number of the non-connection conductive parts of the elastic anisotropic conductive films that are disposed in the peripheral area of the frame plate and are to be connected to one of the integrated circuits on the wafer is referred to as B, the relationship B>A being satisfied (hereinafter may be referred to as "fifth invention").

It is preferable that the anisotropic conductive connector according to the present invention is used to conduct an electrical inspection of each of a plurality of integrated circuits formed on a wafer in a state of the wafer, wherein the anisotropic conductive film placement holes are formed in the frame plate corresponding to electrode regions in which inspection target electrodes are disposed on all or some of the integrated circuits formed on the inspection target wafer.

According to the present invention, there is provided a probe member that is used to conduct an electrical inspection of each of a plurality of integrated circuits formed on a wafer in a state of the wafer, comprising:

an inspection circuit board in which inspection electrodes are formed on a surface thereof in a pattern corresponding to a pattern of inspection target electrodes in the integrated circuits formed on the inspection target wafer, and the above anisotropic conductive connector disposed on the surface of the inspection circuit board.

According to the present invention, there is provided a wafer inspection system to conduct an electrical inspection of each of a plurality of integrated circuits formed on a wafer in a state of the wafer, comprising:

the above probe member, wherein electrical connection with the integrated circuits formed on the inspection target wafer is achieved via the probe member.

In the anisotropic conductive connector according to the first invention, since the connection conductive parts of the elastic anisotropic conductive films disposed in the peripheral area of the frame plate have a thickness smaller than that of the connection conductive parts of the elastic anisotropic conductive films disposed in the center area of the frame plate, a pressing force is sufficiently applied to the connection conductive parts of the elastic anisotropic conductive films disposed in the center area of the frame plate when pressed so that the connection conductive parts are sufficiently compressed. Therefore, uniform conductivity is achieved in all of the connection conductive parts even when the anisotropic conductive connector has a large area.

In the anisotropic conductive connector according to the second invention, since the connection conductive parts of the elastic anisotropic conductive films disposed in the peripheral area of the frame plate is formed of the elastic polymer substance having a durometer hardness higher than that of the elastic polymer substance forming the connection conductive parts of the elastic anisotropic conductive films disposed in the center area of the frame plate, the connection conductive parts of the elastic anisotropic conductive films disposed in the center area of the frame plate are sufficiently compressed by a lower pressing force as compared with the connection conductive parts of the elastic anisotropic conductive films disposed in the peripheral area of the frame plate. Therefore, uniform conductivity is achieved in all of the connection conductive parts even when the anisotropic conductive connector has a large area.

In the anisotropic conductive connector according to the third invention, since the connection conductive parts of the elastic anisotropic conductive films disposed in the peripheral area of the frame plate have a content of the conductive particles higher than that of the connection conductive parts of the elastic anisotropic conductive films disposed in the center area of the frame plate, a decrease in conductivity of the connection conductive parts disposed in the peripheral area of the frame plate can be inhibited even when the anisotropic conductive connector is repeatedly used many times over. Therefore, the anisotropic conductive connector has a long service life.

In the anisotropic conductive connector according to the fourth invention, since the connection conductive parts of the elastic anisotropic conductive films disposed in the peripheral area of the frame plate have a horizontal cross-sectional area larger than that of the connection conductive parts of the elastic anisotropic conductive films disposed in the center area of the frame plate, the connection conductive parts of the elastic anisotropic conductive films disposed in a peripheral area of the frame plate have higher strength as compared with the connection conductive parts of the elastic anisotropic conductive films disposed in the center area of the frame plate and since the connection conductive parts having a large cross-sectional area have a lower electrical resistance, a decrease in conductivity of the connection conductive parts disposed in the peripheral area of the frame plate can be inhibited even when the anisotropic conductive connector is repeatedly used many times over. Therefore, the anisotropic conductive connector has a long service life. Further, the connection conductive parts of the elastic anisotropic conductive films disposed in the center area of the frame plate are sufficiently compressed by a lower pressing force due to small cross-sectional area thereof so that uniform conductivity is achieved in all of the connection conductive parts even when the anisotropic conductive connector is one having a large area.

In the anisotropic conductive connector according to the fifth invention, the total number of the non-connection conductive parts of the elastic anisotropic conductive films that are disposed in the peripheral area of the frame plate and are to be connected to one integrated circuit is larger than the total number of the non-connection conductive parts of the elastic anisotropic conductive films that are disposed in the center area of the frame plate and are to be connected to one integrated circuit, a pressing force applied to the connection conductive parts of the elastic anisotropic conductive films disposed in the peripheral area of the frame plate is dispersed. Therefore, a decrease in conductivity of the connection conductive parts disposed in the peripheral area of the frame plate can be inhibited even when the anisotropic conductive connector is repeatedly used many times over, and the anisotropic conductive connector has a long service life.

BRIEF DESCRIPTION OF THE DRAWINGS

FIG. 2 is a plan view showing, in an enlarged scale, a part of the anisotropic conductive connector shown in FIG. 1.

FIG. 3 is a plan view showing, in an enlarged scale, an elastic anisotropic conductive film in the anisotropic conductive connector shown in FIG. 1.

FIG. 4 is a cross-sectional illustration showing, in an enlarged scale, the elastic anisotropic conductive film of the anisotropic conductive connector shown in FIG. 1.

FIG. 7 is a plan view showing, in an enlarged scale, an elastic anisotropic conductive film disposed in a peripheral area of a frame plate in another example of the anisotropic conductive connector according to the fifth invention of the present invention.

FIG. 8 is a cross-sectional view illustrative of a state in which a molding material layer is formed by applying a molding material to a mold for forming an elastic anisotropic conductive film.

FIG. 9 is a cross-sectional illustration showing, in an enlarged scale, a part of the mold for forming an elastic anisotropic conductive film.

FIG. 10 is a cross-sectional view illustrative of a state in which a frame plate is disposed between an upper mold and a lower mold of the mold shown in FIG. 8 through spacers.

FIG. 11 is a cross-sectional view illustrative of a state in which a molding material layer having an intended configuration is formed between the upper mold and the lower mold in the mold.

FIG. 12 is a cross-sectional illustration showing, in an enlarged scale, the molding material layer shown in FIG. 11.

FIG. 13 is a cross-sectional view illustrative of a state in which a magnetic field having a strength distribution in the thicknesswise direction of the molding material layer is formed in the molding material layer shown in FIG. 12.

EXPLANATION OF SYMBOLS

Figure 1:
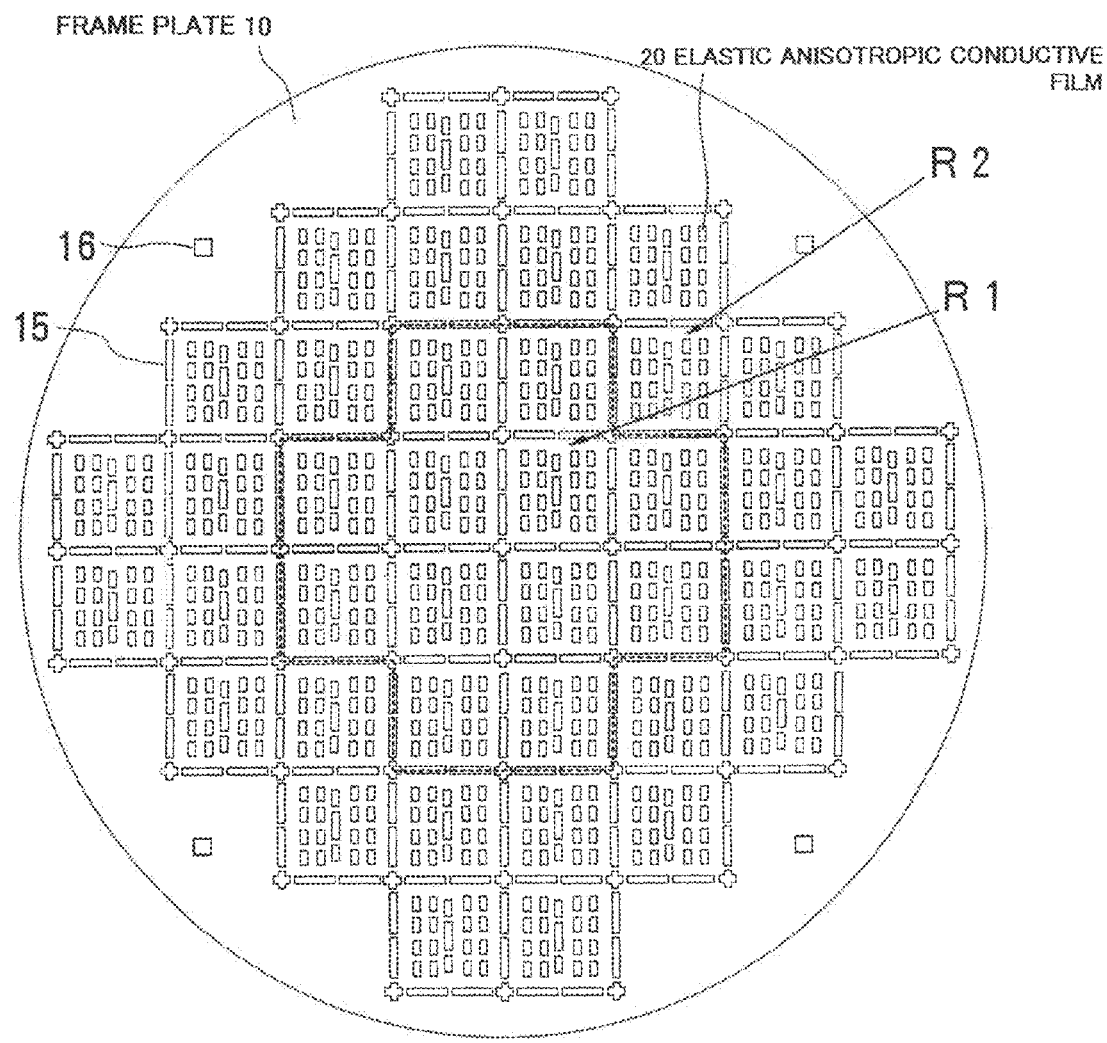
FIG. 1 is a plan view showing an example of an anisotropic conductive connector according to the present invention.

1: Probe member
2: Anisotropic conductive connector
3: Pressing plate
4: Wafer stage
5: Heater
6: Wafer
7: Inspection target electrode
10: Frame plate
11: Anisotropic conductive film placement hole
15: Air circulation hole
16: Positioning hole
20: Elastic anisotropic conductive film
20A: Molding material layer
21: Functional section
22: Connection conductive part
23: Insulating part
24: Protrusion part
25: Supported section
26: Non-connection conductive part
27: Protrusion part
30: Inspection circuit board
31: Inspection electrode
40: Sheet-like connector
41: Insulating sheet
42: Electrode structure
43: Front surface electrode part
44: Back surface electrode part
45: Short-circuiting part
60: Mold
61: Upper mold
62: Substrate
63: Ferromagnetic material layer
64: Non-magnetic material layer
64a: Depression
65: Lower mold
66: Substrate
67: Ferromagnetic material layer
68: Non-magnetic material layer
64b: Depression
69a, 69b: Spacer
P: Conductive particle

BEST MODE FOR CARRYING OUT THE INVENTION

Embodiments of the present invention are described in detail below.

Anisotropic Conductive Connector

FIG. 1 is a plan view showing an example of an anisotropic conductive connector according to the present invention, FIG. 2 is a plan view showing, in an enlarged scale, a part of the anisotropic conductive connector shown in FIG. 1, FIG. 3 is a plan view showing, in an enlarged scale, an elastic anisotropic conductive film in the anisotropic conductive connector shown in FIG. 1, and FIG. 4 is a cross-sectional illustration showing, in an enlarged scale, the elastic anisotropic conductive film of the anisotropic conductive connector shown in FIG. 1.

The anisotropic conductive connector shown in FIG. 1 is used to conduct an electrical inspection of each of a plurality of integrated circuits formed on a wafer in a state of the wafer, for example. As shown in FIG. 2, the anisotropic conductive connector includes a frame plate 10, in which a plurality of anisotropic conductive film placement holes 11 (indicated by broken lines) each extending in the thicknesswise direction of the frame plate 10 are formed through the frame plate 10. The anisotropic conductive film placement holes 11 are formed in the frame plate 10 corresponding to electrode regions in which inspection target electrodes in all integrated circuits formed on an inspection target wafer are disposed. An elastic anisotropic conductive film 20 that exhibits conductivity in its thicknesswise direction is disposed in each of the anisotropic conductive film placement holes 11 in the frame plate 10 so that each elastic anisotropic conductive film 20 is supported by peripheral part of the frame plate 10 around the corresponding anisotropic conductive film placement hole 11 and is arranged in a state separated from the adjacent elastic anisotropic conductive films 20. Air circulation holes 15 are formed in the frame plate 10 according to this example for circulating air between the anisotropic conductive connector and a member adjacent thereto when a vacuum pressing means is used in a wafer inspection system. Positioning holes 16 for positioning an inspection target wafer and an inspection circuit board are also formed in the frame plate 10.

The elastic anisotropic conductive film 20 is formed of an elastic polymer substance and includes, as shown in FIG. 3, a functional section 21 that includes a plurality of connection conductive parts 22 extending in the thicknesswise direction of the elastic anisotropic conductive film 20 (i.e., the direction perpendicular to the paper), and an insulating part 23 formed around the respective connection conductive parts 22 and insulating the connection conductive parts 22 to one another, wherein the functional section 21 is positioned in the anisotropic conductive film placement hole 11 in the frame plate 10. The connection conductive parts 22 included in the functional section 21 are disposed in a pattern corresponding to a pattern of inspection target electrodes of an integrated circuit formed on an inspection target wafer, and are electrically connected to the inspection target electrodes in an inspection of the wafer.

A supported section 25 that is supported by being fixed to peripheral part of the frame plate 10 around the anisotropic conductive film placement hole 11 is integrally formed with the functional section 21 around the functional section 21. Specifically, the supported section 25 according to this example is bifurcated, and is supported being fixed to the frame plate 10 so that the supported section 25 closely holds the peripheral part of the frame plate 10 around the anisotropic conductive film placement hole 11. As shown in FIG. 4, conductive particles P that exhibit magnetism are densely contained in the connection conductive part 22 in the functional section 21 of the elastic anisotropic conductive film 20 so that the conductive particles P are arranged in the thicknesswise direction of the elastic anisotropic conductive film 20. On the other hand, the insulating part 23 contains no or only little amount of the conductive particles P. In the anisotropic conductive connector according to the present invention, it is preferable that a protrusion part which protrudes from its circumferential part is formed in at least the connection conductive part on both surfaces of the elastic anisotropic conductive film. In the example shown in the drawing, a protrusion part 24 that protrudes from its circumferential part is formed at a position corresponding to the connection conductive part 22 and its peripheral area on both surfaces of the functional section 21 of the elastic anisotropic conductive film 20.

The thickness of the frame plate 10 may vary depending on the material thereof, and preferably 25 to 600 μm, and more preferably 40 to 400 μm.

If the thickness of the frame plate 10 is less than 25 μm, the anisotropic conductive connector may not have required strength and its durability may be low at use thereof. Moreover, the frame plate 10 may not have rigidity so that the shape thereof may not be maintained with a result that the handling capability of the anisotropic conductive connector is low. If the thickness of the frame plate 10 is more than 600 μm on the other hand, since the thickness of the elastic anisotropic conductive film 20 formed in the anisotropic conductive film placement hole 11 may be too large, and it may be difficult to achieve excellent conductivity in the connection conductive part 22 and insulation between adjacent connection conductive parts 22 in some cases. The horizontal shape and dimensions of the anisotropic conductive film placement hole 11 in the frame plate 10 are designed corresponding to the dimensions, pitch, and pattern of inspection target electrodes of an inspection target wafer.

The material for forming the frame plate 10 is not particularly limited insofar as the frame plate 10 is not easily deformed and has rigidity to such an extent that the shape thereof is steadily maintained. Various materials such as a metal material, a ceramic material, a resin material, or the like may be used. When the frame plate 10 is formed of a metal material, for example, an insulating film may be formed on a surface of the frame plate 10.

Specific examples of the metal material for forming the frame plate 10 include metals such as iron, copper, nickel, chromium, cobalt, magnesium, manganese, molybdenum, indium, lead, palladium, titanium, tungsten, aluminum, gold, platinum, and silver, alloys of two or more of these metals, alloy steel, and the like.

Specific examples of the resin material for forming the frame plate 10 include a liquid crystal polymer, a polyimide resin, and the like.

In the anisotropic conductive connector used for the WLBI test, it is preferable to use a material having a coefficient of linear thermal expansion of $3 \times 10^{-5}$/K or less, more preferably $-1 \times 10^{-7}$/K to $1 \times 10^{-5}$/K, and particularly preferably $1 \times 10^{-6}$/K to $8 \times 10^{-6}$/K, as a material for forming the frame plate 10.

Specific examples of such a material include invar alloys such as invar, elinvar alloys such as elinvar, other magnetic metal alloys such as super-invar, covar and 42 alloy, alloy steel, and the like.

Whole thickness of the elastic anisotropic conductive film 20 (the thickness of the connection conductive part 22 in the example shown in the drawing) is preferably 50 to 2000 μm, more preferably 70 to 1000 μm, and particularly preferably 80 to 500 μm. If the thickness is 50 μm or more, an elastic anisotropic conductive film 20 having sufficient strength can be surely obtained. If the thickness is 2000 μm or less on the other hand, connection conductive parts 22 having required conductivity characteristics can be surely obtained.

The total protrusion height of the protrusion parts 24 is preferably 10% or more, and more preferably 20% or more, of the whole thickness of the elastic anisotropic conductive film 20 at a position of the protrusion parts 24. By forming the protrusion part 24 having such a protrusion height, the connection conductive part 22 is sufficiently compressed by a low pressing force, and therefore, excellent conductivity can be surely obtained.

The protrusion height of the protrusion part 24 is preferably 100% or less, and more preferably 70% or less, of the minimum width or the diameter of the protrusion part 24. By forming the protrusion part 24 having such a protrusion height, the protrusion part 24 does not buckle when pressed, and therefore, the desired conductivity can be surely obtained.

In the anisotropic conductive connector according to the first invention, the connection conductive parts 22 of the elastic anisotropic conductive films 20 disposed in a peripheral area (i.e., an area outside a broken line in FIG. 1) R2 of the frame plate 10 have a thickness smaller than that of the connection conductive parts 22 of the elastic anisotropic conductive films 20 disposed in a center area (i.e., an area inside the broken line in FIG. 1) R1 of the frame plate 10.

According to this configuration, a sufficient pressing force is also applied to the connection conductive parts 22 of the elastic anisotropic conductive films 20 disposed in the center area R1 of the frame plate 10 when applying a pressing force to the anisotropic conductive connector so that the connection conductive parts 22 are sufficiently compressed. Therefore, uniform conductivity is available in all of the connection conductive parts 22 even when the anisotropic conductive connector has a large area.

The thickness of the supported section 25 (i.e., the thickness of one of the bifurcated portions in the example shown in the drawing) is preferably 5 to 250 μm, more preferably 10 to 150 μm, and particularly preferably 15 to 100 μm.

It is not essential that the supported section 25 is formed bifurcated, but may be fixed to only one surface of the frame plate 10.

As the elastic polymer substance forming the elastic anisotropic conductive film 20, preferred is a heat-resistant polymer substance having a crosslinked structure. As a curable polymer substance-forming material that may be used to obtain such a crosslinked polymer substance, various materials may be used, and a liquid silicone rubber, particularly an addition liquid silicone rubber is preferred.

As such an addition liquid silicone rubber, a commercially available liquid silicone rubber "KE2000" series or "KE1950" series, manufactured by Shin-Etsu Chemical Co., Ltd. may be used.

The elastic polymer material forming the elastic anisotropic conductive film 20 preferably has a durometer A hardness at 23° C. of 10 to 60, more preferably 15 to 60, and particularly preferably 20 to 60. If the durometer A hardness of the elastic polymer material is less than 10, the insulating part 23 insulating the connection conductive parts 22 to one another may be distorted excessively when pressed. As a result, it may be difficult to maintain required insulation among the connection conductive parts 22. If the durometer A hardness of the elastic polymer material is more than 60, a pressing force due to a considerable large load may be required to cause an appropriate distortion to the connection conductive parts 22. As a result, an inspection target wafer may be liable to deform to a large extent, or to break.

When using a silicone rubber cured product having a durometer A hardness outside the above range, the connection conductive parts 22 may easily undergo permanent distortion when the resultant anisotropic conductive connector is repeatedly used many times over. As a result, the chains of the conductive particles of the connection conductive parts 22 may be disordered so that it may be difficult to maintain the required conductivity. When using the anisotropic conductive connector for a test conducted in a high temperature environment, WLBI test for example, it is preferable that the silicone rubber cured product forming the elastic anisotropic conductive film 20 have a durometer A hardness at 23° C. of 25 to 40.

When using a silicone rubber cured product having a durometer A hardness outside the above range, the connection conductive parts 22 may easily undergo permanent distortion when the resultant anisotropic conductive connector is repeatedly used for a test conducted in a high temperature environment. As a result, the chains of the conductive particles of the connection conductive parts 22 may be disordered so that it may be difficult to maintain the required conductivity.

The durometer A hardness of the silicone rubber cured product may be measured by a method in accordance with JIS K 6249.

In the anisotropic conductive connector according to the second invention, the elastic polymer substance forming the connection conductive parts 22 of the elastic anisotropic conductive films 20 disposed in the peripheral area R2 of the frame plate 10 has a durometer hardness higher than that of the elastic polymer substance forming the connection conductive parts 22 of the elastic anisotropic conductive films 20 disposed in the center area R1 of the frame plate 10.

According to this configuration, the connection conductive parts 22 of the elastic anisotropic conductive films 20 disposed in the center area R1 of the frame plate 10 are sufficiently compressed by lower pressing force as compared with the connection conductive parts 22 of the elastic anisotropic conductive films 20 disposed in the peripheral area R2 of the frame plate 10. Therefore, uniform conductivity is available in all of the connection conductive parts 22 even when the anisotropic conductive connector has a large area.

As the conductive particles P contained in the connection conductive part 22 of the elastic anisotropic conductive film 20, it is preferable to use conductive particles obtained by coating the surface of core particles that exhibit magnetism (hereinafter may be referred to as "magnetic core particles") with a highly conductive metal.

The term "highly conductive metal" used herein refers to a metal having a conductivity at 0° C. of $5 \times 10^6$ $\Omega^{-1} m^{-1}$ or more.

The magnetic core particles for the conductive particles P preferably have a number average particle diameter of 3 to 40 μm.

It is noted that the number average particle diameter of the magnetic core particles refers to a value measured by a laser diffraction/scattering method.

If the number average particle diameter as above is 3 μm or more, a connection conductive part 22 that is easily deformed by pressing, has a low resistance, and exhibits high connection reliability can be easily obtained. If the number average particle diameter as above is 40 μm or less, a minute connection conductive part 22 can be easily formed, and moreover, the resulting connection conductive part 22 may have stable conductivity easily.

The magnetic core particles preferably have a coefficient of variation in particle diameter of 50% or less, more preferably 40% or less, still more preferably 30% or less, and particularly preferably 20% or less.

The coefficient of variation in particle diameter is calculated by a formula "$(\sigma/Dn) \times 100$" (wherein $\sigma$ indicates the standard deviation of the particle diameter, and Dn indicates the number average particle diameter).

If the coefficient of variation in particle diameter of the magnetic core particles is 50% or less, connection conductive parts 22 that exhibit a small variation in conductivity can be formed due to the uniformity of the particle diameter.

As the material forming the magnetic core particles, iron, nickel, cobalt, a material prepared by coating such a metal with copper or a resin, or the like may be used. It is preferable to use a material having a saturation magnetization of 0.1 Wb/m$^2$ or more, more preferably 0.3 Wb/m$^2$ or more, and particularly preferably 0.5 Wb/m$^2$ or more. Specific examples of such a material include iron, nickel, cobalt, alloys thereof, and the like.

If the material used has a saturation magnetization of 0.1 Wb/m$^2$ or more, the conductive particles P can be easily moved in a molding material layer for forming the elastic anisotropic conductive films 20 by a method described later. Therefore, the conductive particles P can be reliably moved to an area of the molding material layer that forms the connection conductive part so that chains of the conductive particles P can be formed.

As the highly conductive metal with which the surface of the magnetic core particles is coated, gold, silver, rhodium, platinum, chromium, and the like may be used. Among these, gold is preferable from the viewpoint of chemical stability and high conductivity.

As a method for coating the surface of the magnetic core particles with the highly conductive metal is used electroless plating, displacement plating, or the like. The method of coating is not limited thereto.

The number average particle diameter of the conductive particles P is preferably 3 to 40 μm, and more preferably 6 to 25 μm.

When using such conductive particles P, the resulting elastic anisotropic conductive film 20 can be easily deformed by a pressing. Moreover, a sufficient electrical connection among the conductive particles P can be achieved inside the connection conductive part 22 of the elastic anisotropic conductive film 20.

The shape of the conductive particles P is not particularly limited, but is preferably a sphere, a star, or a lump of an aggregate of secondary particles because the conductive particles P can be easily dispersed in the polymer substance-forming material.

The content of the conductive particles P in the connection conductive part 22 of the functional section 21 is, in terms of volume fraction, 10 to 60%, and preferably 15 to 50%. If the content of the conductive particles P is less than 10 vol %, a connection conductive part 22 exhibiting a sufficiently low electrical resistance may not be obtained. If the content of the conductive particles P is more than 60 vol %, the resulting connection conductive part 22 may become brittle and may not have a required elasticity.

In the anisotropic conductive connector according to the third invention, the connection conductive parts 22 of the elastic anisotropic conductive films 20 disposed in the peripheral area R2 of the frame plate 10 have a content of the conductive particles P higher than that of the connection conductive parts 22 of the elastic anisotropic conductive films 20 disposed in the center area R1 of the frame plate 10.

According to this configuration, a decrease in conductivity of the connection conductive parts 22 of the elastic anisotropic conductive film 20 disposed in the peripheral area R2 of the frame plate 10 can be inhibited even when the anisotropic conductive connector is repeatedly used many tomes over. Therefore, the anisotropic conductive connector can enjoy a long service life.

In the anisotropic conductive connector according to the fourth invention, the connection conductive parts 22 of the elastic anisotropic conductive films 20 disposed in the peripheral area R2 of the frame plate 10 have a horizontal cross-sectional area larger than that of the connection conductive parts 22 of the elastic anisotropic conductive films 20 disposed in the center area R1 of the frame plate 10.

According to this configuration, the connection conductive parts 22 of the elastic anisotropic conductive films 20 disposed in the peripheral area R2 of the frame plate 10 have a strength higher than that of the connection conductive parts 22 of the elastic anisotropic conductive films 20 disposed in the center area R1 of the frame plate 10. Moreover, since the connection conductive part 22 having a large cross-sectional area has a low electrical resistance, a decrease in conductivity of the connection conductive parts 22 of the elastic anisotropic conductive film 20 disposed in the peripheral area R2 of the frame plate 10 can be inhibited even when the anisotropic conductive connector is repeatedly used many times over. Therefore, the anisotropic conductive connector can enjoy a long service life. Since the connection conductive parts 22 of the elastic anisotropic conductive films 20 disposed in the center area R1 of the frame plate 10 are sufficiently compressed by low pressing force due to small cross-sectional area thereof, uniform conductivity is available in all of the connection conductive parts 22 even when the anisotropic conductive connector has a large area.

Figure 5:
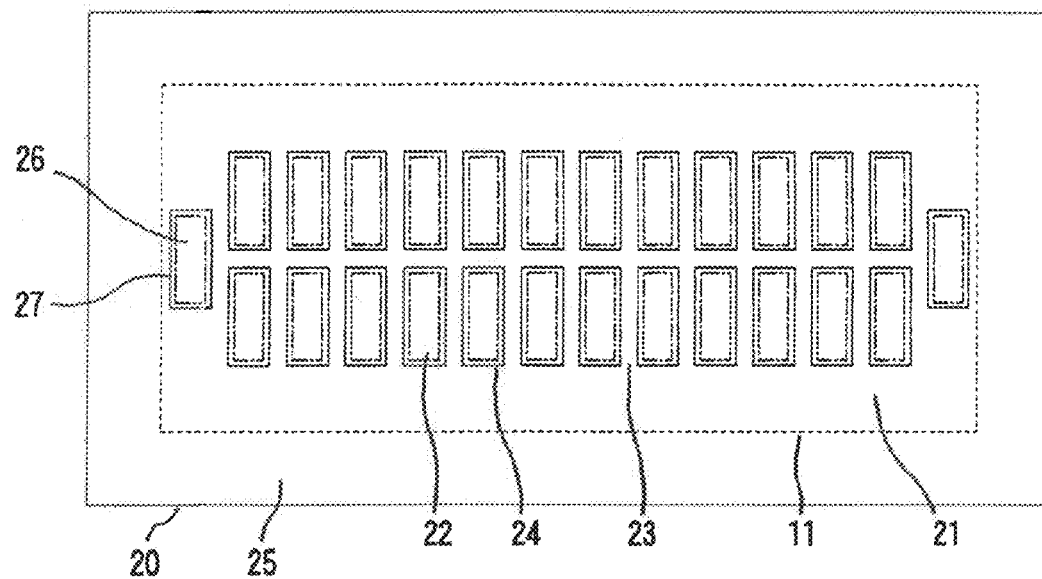
FIG. 5 is a plan view showing, in an enlarged scale, an elastic anisotropic conductive film disposed in a center area of a frame plate in an example of an anisotropic conductive connector according to the fifth invention of the present invention.

In the anisotropic conductive connector according to the fifth invention, as shown in FIG. 5, for example, a plurality of (two in the example as shown) non-connection conductive parts 26 extending in the thicknesswise direction of the elastic anisotropic conductive film 20 are formed in the elastic anisotropic conductive film 20 disposed in the center area R1 of the frame plate 10 in an area other than the area in which the connection conductive parts 22 are formed. The connection conductive parts 22 are arranged in two rows in the functional section 21 of the elastic anisotropic conductive film 20, and the non-connection conductive part 26 is formed on each end of the rectangular area in which the connection conductive parts 22 are formed.

Figure 6:
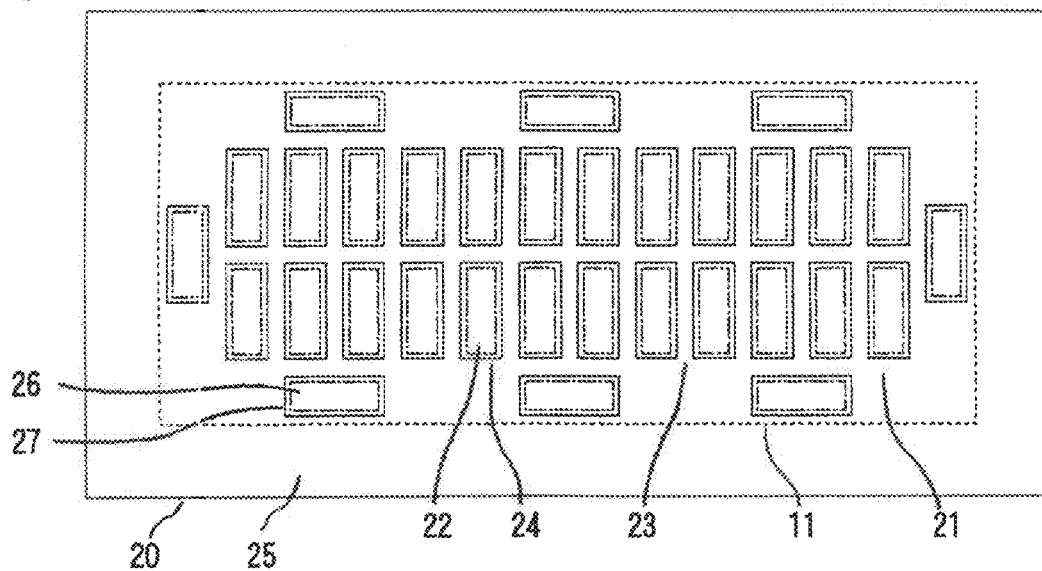
FIG. 6 is a plan view showing, in an enlarged scale, an elastic anisotropic conductive film disposed in a peripheral area of a frame plate in an example of the anisotropic conductive connector according to the fifth invention of the present invention.

As shown in FIG. 6, for example, a plurality of (eight in the example as shown) non-connection conductive parts 26 extending in the thicknesswise direction of the elastic anisotropic conductive film 20 are formed in the elastic anisotropic conductive film 20 disposed in the peripheral area R2 of the frame plate 10 in an area other than the area in which the connection conductive parts 22 are formed. In the example as shown, the connection conductive parts 22 are arranged in two rows in the functional section 21 of the elastic anisotropic conductive film 20, and the non-connection conductive parts 26 are formed in the functional section 21 so as to surround the rectangular area in which the connection conductive parts 22 are formed.

These non-connection conductive parts 26 are not electrically connected to the inspection target electrodes formed in a wafer. Conductive particles that exhibit magnetism are densely contained in the non-connection conductive part 26 so that the conductive particles are aligned in the thicknesswise direction of the elastic anisotropic conductive film 20 in the same manner as the connection conductive parts 22. The non-connection conductive parts 26 are insulated from the connection conductive parts 22 by the insulating part 23.

In the above configuration, it is preferable that at least the non-connection conductive part protrudes from both surfaces of the elastic anisotropic conductive film to form a protrusion part. In the example as shown, a protrusion part 27 that protrudes from the surface of the elastic anisotropic conductive film 20 is formed at a position corresponding to the non-connection conductive part 26 and its peripheral area.

When the total number of the non-connection conductive parts 26 of the elastic anisotropic conductive films 20 that are disposed in the center area of the frame plate 10 and are connected to one integrated circuit on a wafer is referred to as A, and the total number of the non-connection conductive parts 26 of the elastic anisotropic conductive films 20 that are disposed in the peripheral area of the frame plate 10 and are connected to one integrated circuit on a wafer is referred to as B, the relationship B>A is satisfied.

In the anisotropic conductive connector according to the fifth invention, the non-connection conductive part 26 may be formed in the supported section 25, as shown in FIG. 7.

According to this configuration, since the total number of the non-connection conductive parts 26 of the elastic anisotropic conductive films 20 that are disposed in the peripheral area of the frame plate 10 and are connected to one integrated circuit is larger than the total number of the non-connection conductive parts 26 of the elastic anisotropic conductive films 20 that are disposed in the center area of the frame plate 10 and are connected to one integrated circuit, a pressing force applied to the connection conductive parts 22 of the elastic anisotropic conductive film 20 disposed in the peripheral area of the frame plate 10 is dispersed. Therefore, a decrease in conductivity of the connection conductive parts 22 disposed in the peripheral area of the frame plate 10 can be inhibited even when the anisotropic conductive connector is repeatedly used many times over. Therefore, the anisotropic conductive connector can enjoy a long service life.

The anisotropic conductive connector described in the above may be produced as follows, for example.

At first, a frame plate 10 formed of a magnetic metal in which the anisotropic conductive film placement holes 11 are formed corresponding to electrode regions in which inspection target electrodes in all of integrated circuits formed on an inspection target wafer, is produced. As a method for forming the anisotropic conductive film placement holes 11 in the frame plate 10, an etching method or the like may be employed.

Next, a conductive paste composition is prepared in which conductive particles that exhibit magnetism are dispersed in a polymer substance-forming material, preferably an addition liquid silicone rubber, that forms an elastic polymer substance upon curing. As shown in FIG. 8, a mold 60 for forming elastic anisotropic conductive films is provided. The conductive paste composition that is an elastic anisotropic conductive film molding material is applied to the molding surface of each of an upper mold 61 and a lower mold 65 of the mold 60 in a predetermined pattern which is arrangement pattern of elastic anisotropic conductive films to form molding material layers 20A.

The mold 60 is specifically described below. The mold 60 is so constructed that the upper mold 61 and the lower mold 65 making a pair with the upper mold 61, are disposed to face each other.

In the upper mold 61, as shown in FIG. 9 in an enlarged scale, ferromagnetic material layers 63 are formed on the bottom surface of a substrate 62 in a pattern enantiomorphous to the arrangement pattern of the connection conductive parts 22 of the elastic anisotropic conductive film 20 to be formed. A non-magnetic material layer 64 is formed in an area other than the ferromagnetic material layers 63. The molding surface is formed by the ferromagnetic material layers 63 and the non-magnetic material layer 64. Depressions Ma are formed in the molding surface of the upper mold 61 corresponding to the protrusion parts 24 of the elastic anisotropic conductive film 20 to be formed.

On the other hand, in the lower mold 65, ferromagnetic material layers 67 are formed on the top surface of a substrate 66 in a pattern similar to the arrangement pattern of the connection conductive parts 22 of the elastic anisotropic conductive film 20 to be formed. A non-magnetic material layer 68 is formed in an area other than the ferromagnetic material layers 67. The molding surface is formed by the ferromagnetic material layers 67 and the non-magnetic material layer 68. Depressions 68a are formed in the molding surface of the lower mold 65 corresponding to the protrusion parts 24 of the elastic anisotropic conductive film 20 to be formed.

The substrate 62 of the upper mold 61 and the substrate 66 of the lower mold 65 are preferably formed of a ferromagnetic material. Specific examples of the ferromagnetic material include ferromagnetic metals such as iron, an iron-nickel alloy, an iron-cobalt alloy, nickel, and cobalt. The substrates 62 and 66 preferably have a thickness of 0.1 to 50 mm and preferably have a smooth surface treated with chemically degreasing treatment, and mechanically polishing treatment.

As the material for forming the ferromagnetic material layer 63 of the upper mold 61 and the ferromagnetic material layer 67 of the lower mold 65, a ferromagnetic metal such as iron, an iron-nickel alloy, an iron-cobalt alloy, nickel, or cobalt may be used. The ferromagnetic material layers 63 and 67 preferably have a thickness of 10 μm or more. If the thickness is 10 μm or more, a magnetic field having a sufficient strength distribution can be applied to the molding material layer 20A, with a result that the conductive particles can be densely gathered in an area of the molding material layer 20A that forms the connection conductive part 22 so that a connection conductive part 22 having excellent conductivity can be obtained.

As the material for the non-magnetic material layer 64 of the upper mold 61 and the non-magnetic material layer 68 of the lower mold 65, a non-magnetic metal such as copper, a polymer substance having heat-resistance, or the like may be used. It is preferable to use a polymer substance cured by applying radiation, since the non-magnetic material layers 64 and 68 can be easily formed by means of photolithography. A photoresist such as an acrylic dry film resist, an epoxy liquid resist, or a polyimide liquid resist, for example, may be used as the material therefor.

As a method for applying the molding material to the molding surfaces of the upper mold 61 and the lower mold 65, it is preferable to use screen printing method. By such method, it is easy to apply the molding material according to a required pattern and an appropriate amount of molding material can be applied.

Then, as shown in FIG. 10, the frame plate 10 is positioned in a state aligned on the molding surface of the lower mold 65 on which the molding material layer 20A has been formed through a spacer 69a, and the upper mold 61 on which the molding material layer 20A has been formed is positioned in a state aligned on the frame plate 10 through a spacer 69b. The upper mold 61 and the lower mold 65 are then closed to form a molding material layer 20A having an intended configuration (i.e., the configuration of the elastic anisotropic conductive film 20 to be formed) between the upper mold 61 and the lower mold 65, as shown in FIG. 11. In the molding material layer 20A, as shown in FIG. 12, the conductive particles P are dispersed in the entire body of the molding material layer 20A.

By disposing the spaces 69a and 69b between the frame plate 10 and the upper mold 61, and between the frame plate 10 and the lower mold 65, respectively, an elastic anisotropic conductive film having an intended configuration can be formed while preventing a situation in which the adjacent elastic anisotropic conductive films are connected. Therefore, a number of independent elastic anisotropic conductive films can be surely formed.

Thereafter, a pair of electromagnets, for example, are respectively disposed on the top surface of the substrate 62 of the upper mold 61 and the bottom surface of the substrate 66 of the lower mold 65. Since the upper mold 61 and the lower mold 65 include the ferromagnetic material layers 63 and 67, respectively, a magnetic field having a strength higher than that of the peripheral area is formed between the ferromagnetic material layer 63 of the upper mold 61 and the corresponding ferromagnetic material layer 67 of the lower mold 65 by energizing the electromagnets. As a result, the conductive particles P dispersed in the molding material layer 20A are gathered in an area that is positioned between the ferromagnetic material layers 63 of the upper mold 61 and the corresponding ferromagnetic material layers 67 of the lower mold 65 and that forms the connection conductive part 22, and are arranged or oriented in the thicknesswise direction of the molding material layer 20A, as shown in FIG. 13.

Under such a state, the molding material layer 20A is cured to form an elastic anisotropic conductive film 20 that includes a functional section 21 in which a plurality of connection conductive parts 22 each contains the conductive particles P being arranged in the elastic polymer substance in the thicknesswise direction of the elastic polymer substance are insulated by an insulating part 23 that is formed of the elastic polymer substance and contains no or few conductive particles P, and a supported section 25 that is integrally formed with and around the functional section 21 in a state that the supported section 25 is fixed on the frame plate 10 around the anisotropic conductive film placement hole 11. An anisotropic conductive connector is thus produced.

In the above process, the strength of the external magnetic field applied to the area forming the connection conductive part 22 in the molding material layer 20A is preferably 0.1 to 2.5 T (tesla).

Curing treatment of the molding material layer 20A may be appropriately selected depending on the material used, but is normally conducted by heat-treatment. When curing of the molding material layer 20A is conducted by heat-treatment, a heater may be provided in the electromagnet. Specific heating temperature and the heating time are appropriately selected taking account of the kind of the polymer substance-forming material that forms the molding material layer 20A and the like, the time required for the movement of the conductive particles P, and the like.

According to the anisotropic conductive connector according to the first invention or the second invention, uniform conductivity is available in all of the connection conductive parts 22 even when the anisotropic conductive connector has a large area.

According to the anisotropic conductive connector according to the third invention, a decrease in conductivity of the connection conductive parts 22 disposed in the peripheral area R2 of the frame plate 10 can be inhibited even when the anisotropic conductive connector is repeatedly used many times over. Therefore, the anisotropic conductive connector can enjoy a long service life.

According to the anisotropic conductive connector according to the fourth invention, a decrease in conductivity of the connection conductive parts 22 disposed in the peripheral area R2 of the frame plate 10 can be inhibited even when the anisotropic conductive connector is repeatedly used many times over. Therefore, the anisotropic conductive connector can enjoy a long service life, and moreover, uniform conductivity is available in all of the connection conductive parts 22 even when the anisotropic conductive connector has a large area.

Wafer Inspection System

Figure 14:
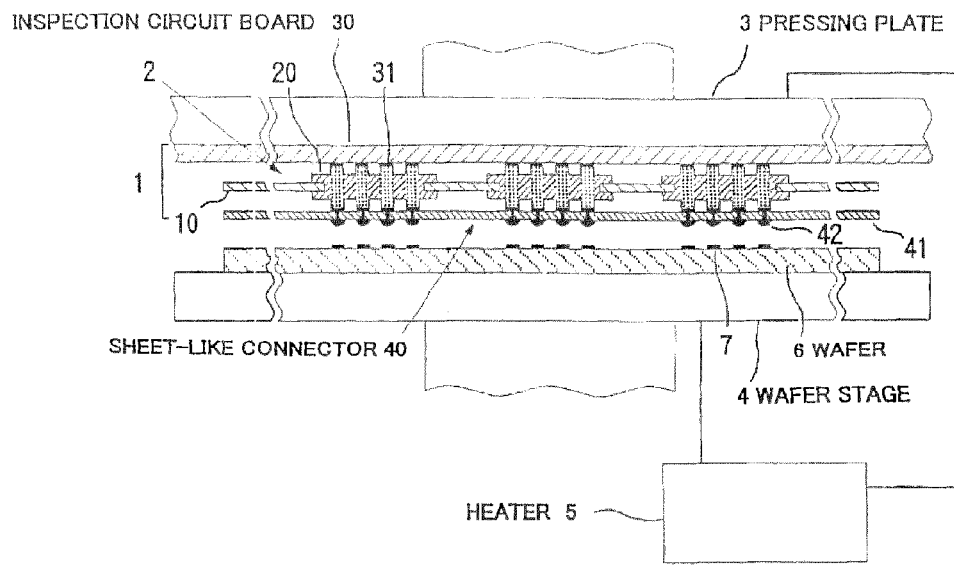
FIG. 14 is a cross-sectional view illustrative of the configuration of an example of a wafer inspection system using the anisotropic conductive connector according to the present invention.

FIG. 14 is a cross-sectional view illustrative of a schematic configuration of an example of a wafer inspection system using the anisotropic conductive connector according to the present invention. The wafer inspection system is used to electrical inspection of a plurality of integrated circuits formed on a wafer in a state of the wafer.

Figure 15:
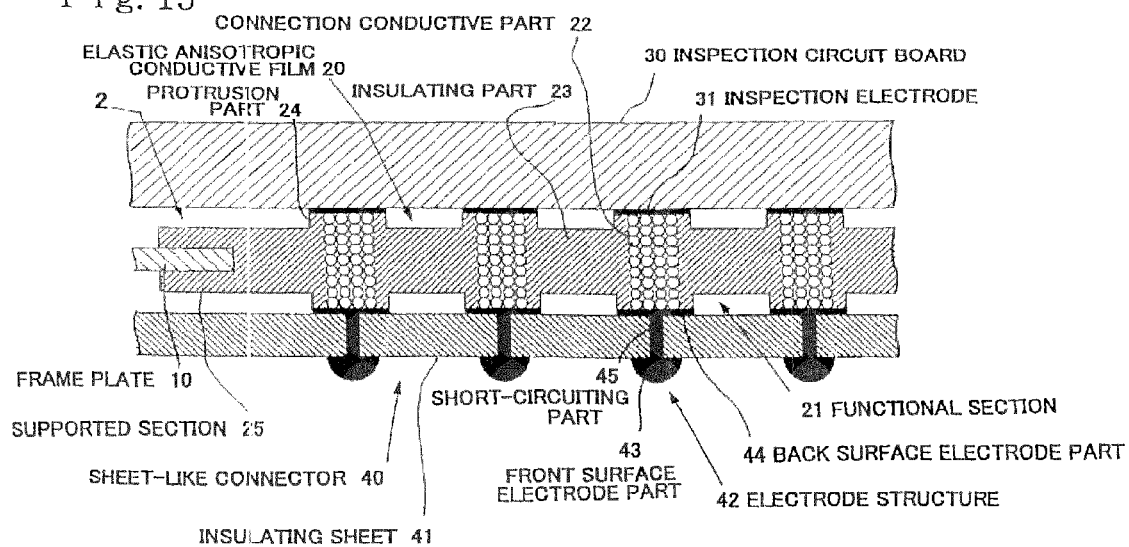
FIG. 15 is a cross-sectional view illustrative of the configuration of the main part of an example of a probe member according to the present invention.

The wafer inspection system shown in FIG. 14 includes a probe member 1 that electrically connects a tester with each inspection target electrodes 7 of an inspection target wafer 6. As shown in FIG. 15 in an enlarged scale, the probe member 1 includes an inspection circuit board 30 in which a plurality of inspection electrodes 31 are formed on a surface (bottom surface in FIG. 15) thereof in a pattern corresponding to the pattern of the inspection target electrodes 7 of the inspection target wafer 6. An anisotropic conductive connector 2 having the configuration shown in FIGS. 1 to 4 is disposed on the surface of the inspection circuit board 30 so that the connection conductive parts 22 of the elastic anisotropic conductive film 20 respectively come into contact with the inspection electrodes 31 of the inspection circuit board 30. A sheet-like connector 40 in which a plurality of electrode structures 42 are disposed in an insulating sheet 41 in a pattern corresponding to the pattern of the inspection target electrodes 7 of the inspection target wafer 6 is disposed on the surface (the bottom surface in FIG. 15) of the anisotropic conductive connector 2 so that the electrode structures 42 respectively come into contact with the connection conductive parts 22 of the elastic anisotropic conductive film 20 of the anisotropic conductive connector 2.

A pressing plate 3 that presses the probe member 1 downward is provided on the back surface (the top surface in FIG. 14) of the inspection circuit board 30 of the probe member 1. A wafer stage 4 on which the inspection target wafer 6 is placed is provided under the probe member 1. A heater 5 is connected to the pressing plate 3 and the wafer stage 4.

As a substrate material forming the inspection circuit board 30, a known substrate material may be used. Specific examples of the substrate material include composite resin materials such as a glass fiber-reinforced epoxy resin, a glass fiber-reinforced phenol resin, a glass fiber-reinforced polyimide resin, and a glass fiber-reinforced bismaleimide-triazine resin, glass, silicon dioxide and ceramic materials such as alumina, and the like.

The sheet-like connector 40 of the probe member 1 is specifically described. The sheet-like connector 40 includes the flexible insulating sheet 41. A plurality of electrode structures 42 formed of a metal and extending in the thicknesswise direction of the insulating sheet 41 are disposed in the insulating sheet 41 in a pattern corresponding to the pattern of the inspection target electrodes 7 of the inspection target wafer 6 in a state spaced in the horizontal direction of the insulating sheet 41 to one another.

Each of the electrode structures 42 is formed by integrally connecting a protruding front surface electrode part 43 exposed on the front surface (the bottom surface in FIG. 15) of the insulating sheet 41 and a plate-like back surface electrode part 44 exposed on the back surface of the insulating sheet 41 via a short-circuiting part 45 that extending through the insulating sheet 41 in the thicknesswise direction of the insulating sheet 41.

The insulating sheet 41 is not particularly limited insofar as it is flexible and has insulating properties. For example, a resin sheet formed of a polyimide resin, a liquid crystal polymer, polyester, a fluorocarbon resin, or the like, a sheet obtained by impregnating woven fiber cloth with the above resin, or the like may be used.

The thickness of the insulating sheet 41 is not particularly limited insofar as it is flexible, but is preferably 10 to 50 µm, and more preferably 10 to 25 µm.

As the metal forming the electrode structure 42, nickel, copper, gold, silver, palladium, iron, or the like may be used. The electrode structure 42 may be formed of a single metal, or may be formed of an alloy of two or more metals, or may be formed by stacking two or more metals.

It is preferable that a film of a metal that is chemically stable and exhibits high conductivity, such as a gold, silver, or palladium is formed on the surfaces of the front surface electrode part 43 and the back surface electrode part 44 of the electrode structure 42 in order to prevent oxidation of the electrode part and obtain an electrode part having a low contact resistance.

In the above electrical inspection system, the inspection target wafer 6 is placed on the wafer stage 4, and the probe member 1 is pressed downward by the pressing plate 3 so that the front surface electrode parts 43 of the electrode structures 42 of the sheet-like connector 40 come into contact with the inspection target electrodes 7 of the wafer 6, and the inspection target electrodes 7 of the wafer 6 are pressed by the respective front surface electrode parts 43. In this state, each of the connection conductive parts 22 of the elastic anisotropic conductive film 20 of the anisotropic conductive connector 2 is compressed by the inspection electrode 31 of the inspection circuit board 30 and the front surface electrode part 43 of the electrode structure 42 of the sheet-like connector 40 in the thicknesswise direction of the elastic anisotropic conductive film 20 so that conductive paths are formed in the connection conductive part 22 in its thicknesswise direction. As a result, electrical connection of the inspection target electrode 7 of the wafer 6 and the inspection electrode 31 of the inspection circuit board 30 is achieved. The wafer 6 is then heated to a predetermined temperature by the heater 5 through the wafer stage 4 and the pressing plate 3, and required electrical inspection on each of the plurality of integrated circuits formed on the wafer 6 is conducted.

According to the above wafer inspection system, since electrical connection of the inspection target electrodes 7 of the inspection target wafer 6 is achieved through the probe member 1 that includes the anisotropic conductive connector 2 as aforementioned, the inspection circuit board can be easily positioned with respect to and secured on the wafer even if the arrangement pitch of the inspection target electrodes 7 is small. Moreover, the desired electrical inspection process can be steadily conducted over a long period of time even when the anisotropic conductive connector is repeatedly used many times over, or repeatedly used for a test conducted in a high temperature environment, for example, WLBI test.

Since the elastic anisotropic conductive film 20 of the anisotropic conductive connector 2 has a small area, the absolute amount of thermal expansion of the elastic anisotropic conductive film 20 in the horizontal direction thereof is small even if heat hysteresis is effected on the elastic anisotropic conductive film 20. Therefore, by using a material having a small coefficient of linear thermal expansion is used as the material for forming the frame plate 10, thermal expansion of the elastic anisotropic conductive film 20 in the horizontal direction is surely limited by the frame plate 10. Therefore, an excellent electrical connection state can be steadily maintained even when conducting the WLBI test on a wafer having a large area.

OTHER EMBODIMENTS

The present invention is not limited to the above embodiments, and various modifications may be made on the above embodiments, as described below.

(1) In the anisotropic conductive connectors according to the first to fourth inventions, a non-connection conductive part that is not electrically connected to the inspection target electrode of a wafer may be formed in the elastic anisotropic conductive film 20 in addition to the connection conductive parts 22.

(2) In the anisotropic conductive connector according to the fifth invention, the non-connection conductive part may not be formed in the elastic anisotropic conductive film 20 disposed in the center area of the frame plate 10.

When a plurality of elastic anisotropic conductive films are connected to one integrated circuit formed on an inspection target wafer as shown in FIG. 1, it suffices that the total number of non-connection conductive parts of the plurality of elastic anisotropic conductive films that are disposed in the peripheral area of the frame plate and are connected to one integrated circuit on the wafer, is larger than the total number of non-connection conductive parts of the plurality of elastic anisotropic conductive films that are disposed in the center area of the frame plate and are connected to one integrated circuit on the wafer.

(3) In the anisotropic conductive connector, it is not essential that the elastic anisotropic conductive film 20 has the protrusion part 24. The elastic anisotropic conductive film 20 may have flat surface at one side or both sides, or a depression may be formed in the elastic anisotropic conductive film 20.

(4) A metal layer may be formed on the surface of the connection conductive part 22 of the elastic anisotropic conductive film 20.

(5) It is not essential to use a spacer in the process forming the molding material layer. The elastic anisotropic conductive film molding space may be provided between the upper mold and the frame plate and between the lower mold and the frame plate by another means.

(6) In the probe member, the sheet-like connector 40 is not essential. The probe member may have such a structure that the elastic anisotropic conductive film 20 of the anisotropic conductive connector 2 comes into contact with the inspection target wafer to achieve electrical connection.

(7) The anisotropic conductive connector according to the present invention may be configured so that the anisotropic conductive film placement holes are formed in the frame plate corresponding to electrode regions in which inspection target electrodes are disposed in some of the integrated circuits formed on an inspection target wafer and the elastic anisotropic conductive films are respectively disposed in these anisotropic conductive film placement holes.

According to such an anisotropic conductive connector, the wafer can be divided into two or more areas, and a probe test can be collectively conducted on the integrated circuits formed in each area.

Specifically, in a wafer inspection method using the anisotropic conductive connector according to the present invention or the probe member according to the present invention, it is not essential to conduct an inspection on all of the integrated circuits formed on a wafer collectively.

Since a burn-in test requires a long time as several hours to conduct inspection on each integrated circuit, a high time efficiency is achieved in collective inspection on all of the integrated circuits formed on the wafer. On the other hand, since a probe test requires only a short time as several minutes to conduct inspection on each integrated circuit, a sufficiently high time efficiency can be achieved even if the wafer is divided into two or more areas, and the probe test is collectively conducted on the integrated circuits formed in each area.

According to the method in which electrical inspections on the integrated circuits formed on the wafer corresponding to each area as divided, when electrical inspection on integrated circuits formed on an 8-inch or 12-inch wafer at a high degree of integration is conducted, the number of inspection electrodes and the number of lines of the inspection circuit board as used can be reduced as compared with the method in which collective inspection is conducted on all of the integrated circuits. This makes it possible to reduce the production cost of the inspection system or device.

Since the anisotropic conductive connector according to the present invention or the probe member according to the present invention has high durability during repeated use, the anisotropic conductive connector does not easily break and need not be frequently replaced with another anisotropic conductive connector when using the anisotropic conductive connector or the probe member for electrical inspection on the integrated circuits formed on a wafer corresponding to each area as divided. Therefore, the inspection cost can be reduced.

(8) The anisotropic conductive connector according to the present invention or the probe member according to the present invention may be used for an inspection of a wafer on which integrated circuits having bump electrodes formed of gold or solder are formed, in addition to an inspection of a wafer on which integrated circuits having flat aluminum electrodes are formed.

(9) The anisotropic conductive connector according to the present invention may have a configuration implemented by combining two or more of the first to fifth inventions. In such a case, an anisotropic conductive connector having the effects of the corresponding inventions can be obtained.

The invention claimed is:

1. An anisotropic conductive connector comprising:
a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein
each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and
an insulating part that insulates the connection conductive parts from one another, and
the connection conductive parts of the elastic anisotropic conductive films disposed in a peripheral area of the frame plate have a thickness smaller than that of the connection conductive parts of the elastic anisotropic conductive films disposed in a center area of the frame plate.

2. An anisotropic conductive connector comprising:
a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and
an insulating part that insulates the connection conductive parts from one another, and
the elastic polymer substance forming the connection conductive parts of the elastic anisotropic conductive films disposed in a peripheral area of the frame plate have a durometer hardness higher than that of the elastic polymer substance forming the connection conductive parts of the elastic anisotropic conductive films disposed in a center area of the frame plate.

3. An anisotropic conductive connector comprising:
a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and
an insulating part that insulates the connection conductive parts from one another, and
the connection conductive parts of the elastic anisotropic conductive films disposed in a peripheral area of the frame plate have a content of the conductive particles higher than that of the connection conductive parts of the elastic anisotropic conductive films disposed in a center area of the frame plate.

4. An anisotropic conductive connector comprising:
a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and
an insulating part that insulates the connection conductive parts from one another, and
the connection conductive parts of the elastic anisotropic conductive films disposed in a peripheral area of the frame plate have a horizontal cross-sectional area larger than that of the connection conductive parts of the elastic anisotropic conductive films disposed in a center area of the frame plate.

5. An anisotropic conductive connector that is used to conduct an electrical inspection of each of a plurality of integrated circuits formed on a wafer in a state of the wafer, comprising:
a frame plate in which a plurality of anisotropic conductive film placement holes each extending in a thicknesswise direction thereof are formed, and a plurality of elastic anisotropic conductive films respectively disposed in the anisotropic conductive film placement holes in the frame plate and supported by peripheral part of the frame plate around the corresponding anisotropic conductive film placement hole, wherein each of the elastic anisotropic conductive films includes a plurality of connection conductive parts each extending in a thicknesswise direction of the elastic anisotropic conductive film, being disposed corresponding to a connection target electrode, and comprising an elastic polymer substance and magnetic conductive particles densely contained in the elastic polymer substance; and
an insulating part that insulates the connection conductive parts from one another, and at least the elastic anisotropic conductive films disposed in a peripheral area of the frame plate further include, in addition to the connection conductive parts, a non-connection conductive part extending in the thicknesswise direction of the elastic anisotropic conductive film and contain magnetic conductive particles densely in an elastic polymer substance; and
when the total number of the non-connection conductive parts of the elastic anisotropic conductive films that are disposed in a center area of the frame plate and are to be connected to one of the integrated circuits on the wafer is referred to as A, and the total number of the non-connection conductive parts of the elastic anisotropic conductive films that are disposed in the peripheral area of the frame plate and are to be connected to one of the integrated circuits on the wafer is referred to as B, the relationship B>A being satisfied.

6. The anisotropic conductive connector according to any one of claims 1 to 5 which is used to conduct an electrical inspection of each of a plurality of integrated circuits formed on a wafer in a state of the wafer, wherein the anisotropic conductive film placement holes are formed in the frame plate corresponding to electrode regions in which inspection target electrodes are disposed on all or some of the integrated circuits formed on the inspection target wafer.

7. A probe member that is used to conduct an electrical inspection of each of a plurality of integrated circuits formed on a wafer in a state of the wafer, comprising:
   an inspection circuit board in which inspection electrodes are formed on a surface thereof in a pattern corresponding to a pattern of inspection target electrodes in the integrated circuits formed on the inspection target wafer, and the anisotropic conductive connector according to claim 6 disposed on the surface of the inspection circuit board.

8. A wafer inspection system to conduct an electrical inspection of each of a plurality of integrated circuits formed on a wafer in a state of the wafer, comprising:
   the probe member according to claim 7, wherein electrical connection with the integrated circuits formed on the inspection target wafer is achieved via the probe member.

* * * * *